(12) United States Patent
Hill et al.

(10) Patent No.: US 6,412,091 B2
(45) Date of Patent: Jun. 25, 2002

(54) ERROR CORRECTION SYSTEM IN A PROCESSING AGENT HAVING MINIMAL DELAY

(75) Inventors: David L. Hill, Cornelius; Chinna Prudvi; Derek T. Bachand, both of Portland; Paul Breuder, Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/848,261

(22) Filed: May 4, 2001

Related U.S. Application Data

(63) Continuation of application No. 09/197,582, filed on Nov. 23, 1998.

(51) Int. Cl.$^7$ .............................................. H03M 13/00
(52) U.S. Cl. ....................................... 714/785; 714/746
(58) Field of Search ................................. 714/785, 746, 714/42

(56) References Cited

U.S. PATENT DOCUMENTS

| | | | | |
|---|---|---|---|---|
| 5,146,461 | A | 9/1992 | Duschatko et al. | 714/772 |
| 5,384,788 | A | 1/1995 | Parks et al. | 714/758 |
| 5,477,551 | A | 12/1995 | Parks et al. | 714/758 |
| 5,867,510 | A | 2/1999 | Steele | 370/314 |
| 6,216,247 | B1 * | 4/2001 | Creta et al. | 714/42 |

* cited by examiner

Primary Examiner—Phung M. Chung
(74) Attorney, Agent, or Firm—Kenyon & Kenyon

(57) ABSTRACT

An error correction system in an agent provides an error correction in a circuit path extending from an internal cache to an output of the agent. When data errors are detected for data to be processed internally within the agent, the error correction system passes the corrupted data through the error correction circuit, and out of the agent and back into the agent. The error correction changes internal data requests into an external transaction when data errors are detected.

19 Claims, 1 Drawing Sheet

ERROR CORRECTION SYSTEM IN A PROCESSING AGENT HAVING MINIMAL DELAY

This application is a continuation of Ser. No. 09/197,582 Nov. 23, 1998.

BACKGROUND

The present invention relates to an error correction mechanism in a processing agent.

As is known, an agent may store data in an internal cache. Error correction codes permit a processing agent to identify corrupted data and determine whether the corrupted data can be corrected. Error correction techniques typically provide an error correction code associated with the data. When the data is stored, an error correction code, called a "syndrome," is generated from the data and stored in association therewith. While the data is stored in the cache, it may suffer some type of data error. A second syndrome is generated from the data when it is retrieved from the cache. If the first syndrome and the second syndrome do not agree, a data error is identified. The syndromes may be used to identify and, possibly correct small errors. Typically, a one bit error in the data may be corrected based on the syndrome but a multi-bit error can not be corrected.

Error correction is a two-step process: error detection and data correction. In a first step, the locally generated syndrome is compared against the previously stored syndrome to detect errors. If an error is detected, a second step corrects the data where possible.

It is conventional to include error correction circuits in processing agents. Typically, error correction circuitry is included in an "outbound path" from the internal cache of an agent to its external bus. That is, when cached data is output from the agent, it passes through an error correction circuit as it propagates to an output of the agent. The error correction circuit corrects correctable errors present in the data.

Some agents also may include error correction circuits placed in an "inbound path" from the internal cache to, say, the agent's processing core. If used, the error correction circuit adds a predetermined amount of latency for every read of data from the internal cache to the core such an increase in latency is disfavored.

It is a goal of processing agents to process only non-corrupted data. Accordingly, error detection and correction must be performed on corrupted data before such data is processed by an agent.

It is also a goal of processing systems to retrieve and use data as quickly as possible. "Latency," a time measured from the time a data request originates within an agent to the time that the data request is fulfilled, should be minimized. Error detection and correction circuitry increase data latency. If error correction and detection were performed every time data is retrieved from a cache, it would impose at least a two-cycle delay to every data retrieval operation: a first cycle would be consumed for error detection and a second cycle (or possibly several clock cycles) would be consumed for error correction. Adding latency to data retrieval operations for error detection and correction is disadvantageous because data corruption, although it significantly impairs processing performance when it is not detected, occurs relatively infrequently. Error detection and correction would impose a multi-cycle delay to every data transaction regardless of whether the transaction implicates corrupted data.

Accordingly, there is a need in the art for an error detection and correction mechanism in a processing agent that minimizes latency of data transactions that do not involve corrupted data but also prevents an agent from using corrupted data.

SUMMARY

Embodiments of the present invention provide an error correction method in an agent for stored data in which error detection is applied to requested data. When an error is detected, the requested data is output from the agent through an error correction circuit.

DETAILED DESCRIPTION

Embodiments of the present invention provide a processing agent that beneficially performs error detection and data correction with minimal additional latency for uncorrupted data. Requested data is output from a cache through one of two paths. Data is output through a first path if no error is detected. Data is output through a second, longer path that includes error correction circuitry. The two-path embodiments impose a minimal amount of delay to data transactions involved non-corrupted data but also ensure that corrupted data is corrected.

Figure 1:
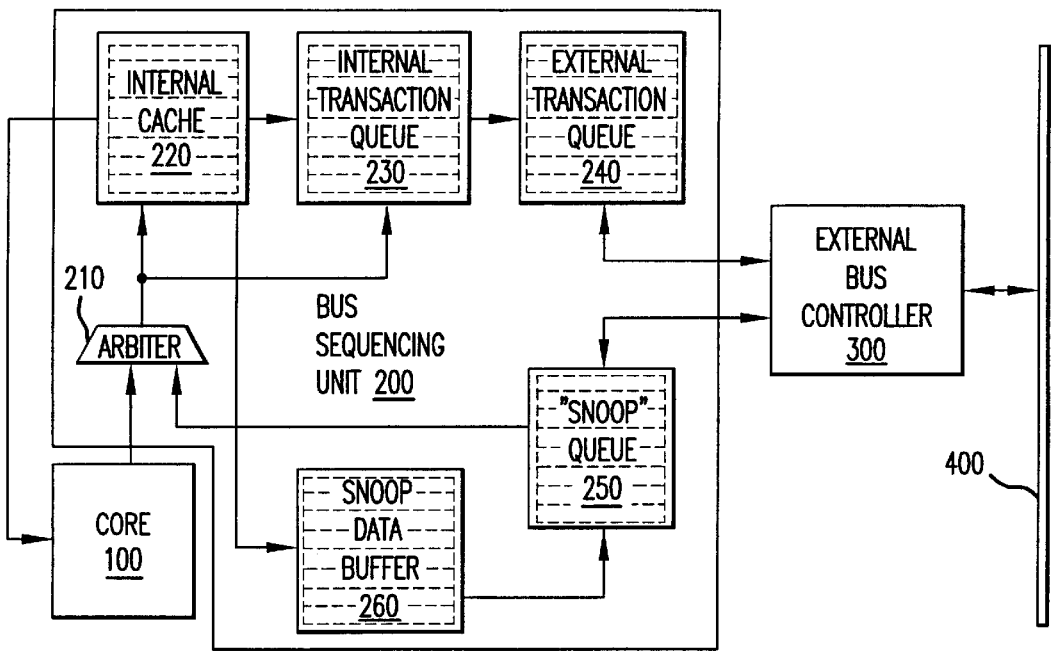
FIG. 1 is a block diagram of a bus sequencing unit in an agent adapted for use with embodiments of the present invention.

A greater understanding of the principles of the present invention are obtained through an illustration of the present invention as integrated into a processing agent such as the one shown in FIG. 1. In FIG. 1, an agent may include a processing core 100, a bus sequencing unit 200 ("BSU") and a external bus controller 300 ("EBC"). The EBC 300 interfaces the agent to an external bus 400. Program execution and data manipulation are performed by the core 100. Data requests from the core 100 first are input to the BSU 200. The BSU 200 satisfies the data request if it can. Otherwise, the BSU 200 generates a transaction on the external bus 400. The EBC 300 generates signals on the external bus 400 as directed by the BSU 200.

The BSU 200 may be populated by an arbiter 210, an internal cache 220, an internal transaction queue 230, an external transaction queue 240, a snoop queue 250 and a snoop data buffer 260. The arbiter 210 receives requests from the core 100 and from other components within the agent. Of the possibly many requests made to the arbiter 210 simultaneously, the arbiter 210 selects one and outputs it to both the internal cache 220 and the internal transaction queue 230.

The internal cache 220 is a cache populated by a plurality of cache entries. Each cache entry 221 may store data of a predetermined length. The internal cache 220 also possesses control logic (not shown) that determines whether a data request "hits" (can be satisfied by) the internal cache 220. For a read request, the read hits the internal cache 220 if the cache stores the requested data. If so, the internal cache 220 outputs the requested data to the core 100 via an output path (not shown).

The internal transaction queue 230 stores all requests from the arbiter 210. As requests advance out of the internal transaction queue 230, the internal transaction queue 230 determines whether the internal cache 220 fulfilled the data request. If so, the internal transaction queue 230 drops the request. Otherwise, if the request "misses" the internal cache 220, the internal transaction queue 230 forwards the request to the external transaction queue 240.

The external transaction queue 240 generates requests on the external bus 400. The external transaction queue 240 also manages the transactions on the external bus 400 through to completion. For example, when requested data is available on the external bus 400, the external transaction queue 240 causes the data to be routed to the core 100 and/or to the internal cache 220 as appropriate.

The snoop queue 250 performs cache coherency functions. Data often may be shared by agents in a multi-agent system. "Cache coherency" ensures that agents operate on the most current copy of data available in the system. The agents exchange "snoop" signals to implement such cache coherency functions. The snoop queue 250 monitors transactions on the external bus, determines whether a particular transaction must be snooped within the agent, and if so, issues snoop probes to various caches within the agent. For example, in the agent shown in FIG. 1, the snoop queue 250 may issue snoop probes to any caches within the core 100, to the internal cache 220 and to the internal and external transaction queues 230 and 240.

The snoop data buffer 260 stores data to be output on the external bus via an implicit writeback. As is known, in a multi-agent system, it is possible that an agent will possess a copy of data that is more current than the copy present in external memory. If a second agent requests the data, it obtains the requested data from the first agent rather than the memory. Internally within the agent, the snoop data buffer 260 receives snooped data from various caches within the agent. The most current copy available is output from the snoop data buffer 260 to the external bus through the snoop queue 250.

Figure 2:
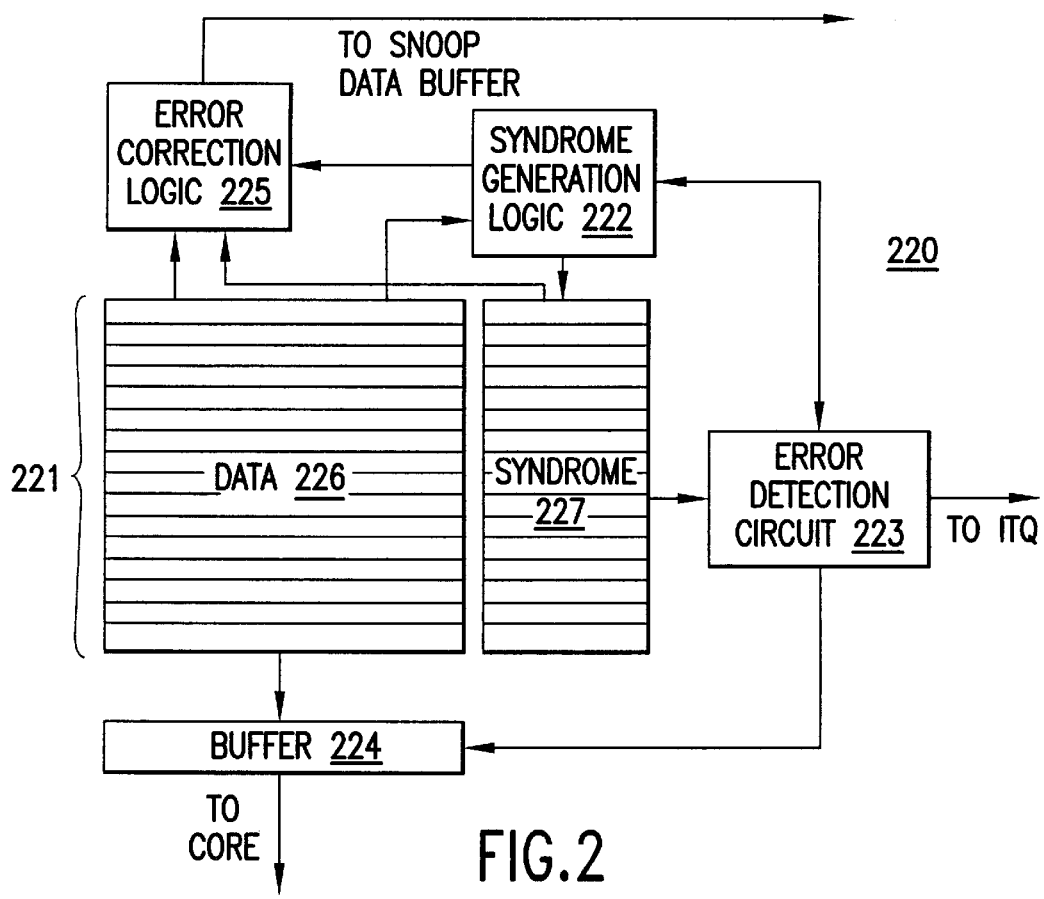
FIG. 2 is a partial block diagram of an internal cache constructed according to an embodiment of the present invention.

FIG. 2 illustrates circuitry of an internal cache 220 constructed in accordance with an embodiment of the present invention. As shown, the internal cache 220 may include a plurality of cache entries 221, a syndrome generator 222, an error detector 223, a data buffer 224, and error correction logic 225. The cache entries 221 include a data portion 226 and a syndrome portion 227. When data is first stored in a cache entry 221, the syndrome generator 222 receives the data and generates a syndrome therefrom. Data is stored in the data portion 226 of a cache entry 221 and its associated syndrome is stored in the syndrome portion 227.

When read requests hit the internal cache 220, the requested data is output from the data portion 226 of a cache entry 221 to the buffer 224. From the buffer 224, the data is routed out of the internal cache 220 to the "requester," the component that issued the data request.

The requested data also is output from the cache entry 221 to the syndrome generator 222 at the same time that the data is output to buffer 224. Based on the data retrieved from the data portion 226, the syndrome generator 222 generates a locally generated syndrome for the error detector 223. The error detector 223 also retrieves the earlier stored syndrome from the syndrome portion 227 of the cache entry 221. The error detector 223 determines whether the previously stored syndrome agrees with the locally generated syndrome. If not, a data error exists.

In response to a data error, the error detection circuit 223 signals the internal transaction queue 230 identifying the data error. The error detection circuit 223 also signals the requestor identifying the error.

The error correction logic 225 is provided in the cache in a circuit path between the internal cache 220 and the snoop data buffer 260. The error correction logic 225 receives data from the data portion of a cache entry 221. It also receives the locally generated syndrome from the syndrome generator 222 and the previously stored syndrome from the syndrome portion 227 of the cache entry.

Operation of an embodiment of the agent is described with reference to FIGS. 1 and 2. When the arbiter 210 (FIG. 1) passes a data request, the data request is output to both the internal cache 220 and the internal transaction queue 230. The request hits the internal cache 220. Accordingly, the internal cache 220 outputs the requested data from the data portion 226 of one of the cache entries 221 (FIG. 2) to the output data buffer 224 and from the data buffer 224 to the core 100 (FIG. 1). If the data is corrupted, the locally generated syndrome generated by the syndrome generator 222 (FIG. 2) and the previously generated syndrome from the cache entry 221 will disagree. The error detector 223 signals a data error to the internal transaction queue 230 and to the core 100 (FIG. 1). Although the internal cache 220 satisfied the data requested, the presence of a data error causes the internal transaction queue 230 to treat the data request as if it missed the internal cache 220. The core 100 treats the request as if it were denied, even though it received data in response thereto. As is known, the core 100 will reschedule the denied data request with possibly other data requests and will retry the denied data request sometime later.

When the data request advances out of the internal transaction queue 230, it is forwarded to the external transaction queue 240. The external transaction queue 240 generates a bus transaction on the external bus 400 that, when decoded by the snoop queue 250, causes the snoop queue 250 to "self snoop" the data. For example, the data transaction may be a traditional read request. In response to the self-snoop, one of two responses may occur: If another agent or an external memory (not shown) stores a current copy of the data, the agent simply will read a new copy of the data from the other agent or memory. But if the most current copy of the data is stored in the agent itself, the self-snoop draws the corrupted data through the error correction logic 225 (FIG. 2) to the snoop data buffer 260 (FIG. 1). From the snoop data buffer 260, corrected data is placed on the external bus 400 and read back to the internal cache via the external transaction queue 230.

As is known, cache coherency may cause an agent to assign a "state" to copies of data that the agent caches internally. The state may identify whether the cached copy is more current than corresponding copies in an external memory (not shown). According to an embodiment of the present invention, when the data request advances out of the external transaction queue 240, the queue 240 may generate a read transaction directed to the copy of data. The state in which the agent caches the copy may determine whether the read transaction causes a new copy of data to be read from the external memory or whether the corrupted data is drawn through the error correction logic 225.

For example, the present invention may be integrated into an agent that operates according to the external bus protocol of the Pentium® Pro processor. That protocol operates according to the known "MESI" cache coherency protocol in which data is assigned one of four states: Invalid, Shared, Exclusive or Modified. According to the protocol, only data stored in modified state may be more current than a corresponding copy in external memory. Thus, if the external transaction queue 240 issues a read transaction on the external bus, the snoop queue will draw corrupted data through the error correction logic 225 only if the corrupted data is stored in the internal cache in the modified state. For data in invalid, shared or exclusive state, the agent simply may read new data from external memory.

It will be appreciated that the operation of the present invention causes data to be read from the internal cache 220 and provided to the core 100 immediately. Error detection is performed in parallel with the routing of data to the core 100. The core 100, upon receipt of the data, does not immediately begin to process it. Instead, it waits to begin processing until the time for determining whether the data contains an error has passed. Although the core 100 does not process the data, the present invention improves throughput of processing by the core 100. The core 100 still is able to perform preparatory action preliminary to processing. For example, as is known, a core often must cache data in a lower-level cache before the data may be processed. Data would be stored first in the lower-level cache then read out of the cache for processing. The act of storing data in the lower-level cache consumes time. By utilizing the present invention, the data may be stored in lower-level cache while error detection is performed in the error detector 223. This parallel processing conserves time.

Thus, embodiments of the present invention provide a processing agent that performs error detection and correction with minimal additional latency for uncorrupted data. Uncorrupted data is output directly from the cache without passing through an error correction stage while corrupted data is output through a second, indirect path that includes error correction. The two-path embodiment imposes a minimal amount of delay to data transactions involved non-corrupted data but also ensure that corrupted data is corrected. It also conserves area of the agent when it is manufactured as an integrated circuit because only one error correction circuit is needed for both internal and external data paths.

We claim:

1. A data processing agent, comprising:
    an internal cache memory;
    an error detection circuit coupled to the internal cache memory via a first communication path;
    an error correction circuit coupled to the internal cache memory via a second communication path; and
    a controller responsive to an error detected by the error detection circuit, to output corrupted data from the agent through the error correction circuit.

2. The data processing agent of claim 1, wherein the controller posts corrected data as part of an external transaction.

3. The data processing agent of claim 1, wherein the controller generates corrected data as part of a self-snoop operation conducted by the agent.

4. An agent having an error correction feature, comprising:
    an internal cache memory;
    a controller responsive to a received data request, including:
        means for retrieving the requested data from the internal cache memory,
        means for detecting an error in the requested data, and responsive to the detected error,
            means for correcting the data,
            means for outputting the corrected data from the agent, and
            means for retrieving the corrected data back to the agent.

5. The data processing agent of claim 4, wherein the outputting means outputs corrected data as part of an external transaction posted by the agent.

6. The data processing agent of claim 4, wherein the outputting means outputs corrected data as part of a self-snoop operation conducted by the agent.

7. The data processing agent of claim 4, wherein the means for outputting further comprises outputting corrected data on a bus external to the agent and wherein the means for retrieving further comprises retrieving the corrected data back to the agent from the bus.

8. The data processing agent of claim 4, wherein the means for retrieving further comprises storing the corrected data in the internal cache memory.

9. An agent having an error correction feature, comprising:
    an internal cache memory;
    means for receiving a request for data;
    means for retrieving the requested data and a previously stored syndrome from the internal cache memory;
    means for generating a local syndrome based on the retrieved data; and
    means for generating an external read transaction for the requested data when the previously stored syndrome and the locally generated syndrome disagree.

10. The agent of claim 9, further comprising an external bus controller coupled to an output of the agent.

11. The agent of claim 9, the internal cache memory further comprising an error correction circuit.

12. The agent of claim 9, wherein the means for generating an external read transaction includes snooping within the agent for the requested data.

13. The data processing agent of claim 9, wherein the means for generating an external read transaction further comprises outputting the requested data to an error correction circuit when the requested data is stored in the agent in a modified state.

14. The data processing agent of claim 9, wherein the means for generating an external read transaction further comprises reading a new copy of the requested data from o outside the agent when the requested data is not stored in the agent in a modified state.

15. An agent, comprising:
    a core;
    a cache coupled to the core via a first communication path;
    an error detector provided within the first communication path;
    a snoop buffer coupled to the cache via a second communication path; and
    an error corrector provided within the second communication path.

16. The agent of claim 15, wherein, responsive to an error detected in a data item, the data item is routed to the snoop buffer.

17. An agent, comprising:
    a core;
    a cache coupled to the core via a first communication path;
    an error detector provided within the first communication path; and
    an output of the agent coupled to the cache via a second communication path; and
    an error corrector provided within the second communication path.

18. The agent of claim 17, wherein, responsive to an error detected in a data item, the data item is routed through error corrector to the output of the agent.

19. The agent of claim 17, wherein the output of the agent is coupled to a snoop buffer.

* * * * *